United States Patent
Hsieh et al.

(10) Patent No.: US 7,696,769 B2
(45) Date of Patent: Apr. 13, 2010

(54) METHOD OF OBTAINING ACCURATELY A HEAT-DISSIPATING REQUIREMENT FOR ELECTRONIC SYSTEMS

(75) Inventors: Yi-Shih Hsieh, Taipei Hsien (TW); Fa-Yin Yan, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 282 days.

(21) Appl. No.: 11/967,100

(22) Filed: Dec. 29, 2007

(65) Prior Publication Data

US 2009/0165990 A1 Jul. 2, 2009

(51) Int. Cl.
G01R 31/28 (2006.01)
G01K 1/00 (2006.01)
(52) U.S. Cl. ........................... 324/760; 702/130
(58) Field of Classification Search ............. 324/158.1, 324/760, 765; 702/130; 713/320–324; 716/4
See application file for complete search history.

(56) References Cited

U.S. PATENT DOCUMENTS 6,006,168 A * 12/1999 Schumann et al. .......... 702/132
7,257,511 B1 * 8/2007 Hsieh et al. ................. 702/130
7,291,995 B2 * 11/2007 Chen .......................... 318/268
7,480,585 B2 * 1/2009 Johns et al. ................. 702/130
7,512,530 B2 * 3/2009 Aguilar et al. ............... 703/13

* cited by examiner

Primary Examiner—Ernest F Karlsen
(74) Attorney, Agent, or Firm—Frank R. Niranjan

(57) ABSTRACT

A method of obtaining accurately a heat-dissipating requirement for electronic systems of a same kind uses a thermal analysis software, a passed thermal module with a fan, and a fan speed regulating device. The method includes steps of: (1) connecting the fan to the fan speed regulating device; (2) turning on one electronic system and running the fan, monitoring the electronic system; (3) reducing the speed of the fan until the electronic system is shut down, recording the fan speed; (4) getting a thermal resistance (Ri) of the thermal module when it runs in an open space with the fan running at the speed at which the electronic system is shut down; (5) repeating above four steps to get some Ri's of some other such electronic systems; (6) using the thermal analysis software to analyze the Ri's of the electronic systems and getting accurately the heat-dissipating requirement for the electronic systems.

5 Claims, 2 Drawing Sheets

METHOD OF OBTAINING ACCURATELY A HEAT-DISSIPATING REQUIREMENT FOR ELECTRONIC SYSTEMS

BACKGROUND OF THE INVENTION

1. Field of the Invention

The present invention relates to a method of obtaining accurately a heat-dissipating requirement for electronic systems.

2. Description of Related Art

As electronic systems such as computers, servo systems continue to advance, they produce more and more heat which must be removed. Thermal design management has become a critical issue in the design process of electronic systems. Therefore, it is necessary to provide a method of obtaining accurately a heat-dissipating requirement for electronic systems, so that thermal modules used to cool the electronic systems can keep the electronic system working within an acceptable temperature range.

A conventional method of obtaining a heat-dissipating requirement for electronic systems includes following steps: testing a plurality of thermal modules in processing lines to find out thermal modules, that meets certain requirements; putting the found-out thermal modules into one electronic system and checking whether the found-out thermal modules can keep the electronic system working within an acceptable temperature range; if can, an upper control limit (UCL) of the heat dissipation efficiency of the thermal modules is regarded as the heat-dissipating requirement of the electronic system.

However, in the conventional method, only the variation of the thermal modules has been considered, while the variation of the electronic systems has not been considered. The variation of the electronic systems may result in that some electronic systems have quite different heat-dissipating requirements. Therefore, there is still a risk that the thermal modules having passed the above test can not meet heat-dissipating requirements of some electronic systems.

What is needed, therefore, is a method of obtaining accurately a heat-dissipating requirement for electronic systems.

SUMMARY OF THE INVENTION

In accordance with an embodiment of the present invention, a method of obtaining accurately a heat-dissipating requirement for electronic systems of a same kind uses a thermal analysis software, a passed thermal module with a fan, and a fan speed regulating device. The method including steps of: (1) thermally attaching the passed thermal module to an electronic system being tested and connecting the fan to the fan speed regulating device; (2) turning on the electronic system, running the fan, and monitoring the electronic system; (3) reducing the speed of the fan until the electronic system is shut down, and recording the fan speed at which the electronic system is shut down; (4) getting a thermal resistance (Ri) of the thermal module when the thermal module runs in an open space with the fan running at the speed at which the electronic system is shut down, wherein the Ri is regards as the electronic system's heat-dissipating requirement; (5) replacing the electronic system with another such electronic system and repeating the above four steps to get the Ri of the another electronic systems, until a plurality of thermal resistances corresponding to a plurality of such electronic systems are obtained; (6) using the thermal analysis software to analyze the Ri's of the electronic systems and getting a lower control limit (LCL) of a heat-dissipating requirement for the electronic systems.

Other advantages and novel features of the present invention will become more apparent from the following detailed description when taken in conjunction with the accompanying drawings, in which:

BRIEF DESCRIPTION OF THE DRAWINGS

Many aspects of the present method can be better understood with reference to the following drawings. The components in the drawings are not necessarily drawn to scale, the emphasis instead being placed upon clearly illustrating the principles of the present method. Moreover, in the drawings, like reference numerals designate corresponding parts throughout the several views.

DETAILED DESCRIPTION OF THE INVENTION

Figure 1:
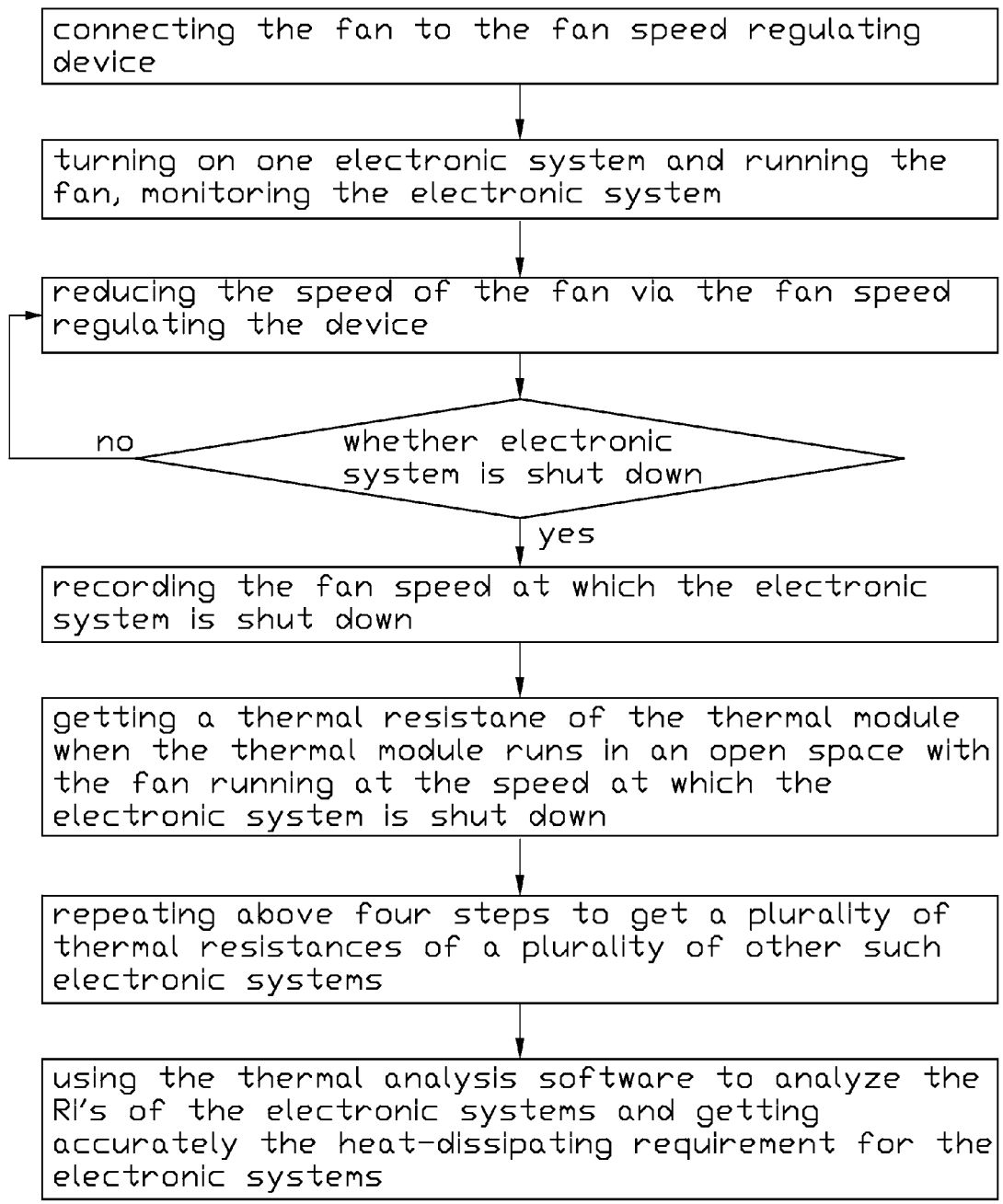
FIG. 1 is a flow chart of steps of a method of obtaining accurately a heat-dissipating requirement for electronic systems in accordance with a preferred embodiment of the present invention.

FIG. 1 is a flow chart of steps of a method of obtaining accurately a heat-dissipating requirement for electronic systems of a same kind according to a preferred embodiment of the invention. The method uses a thermal analysis software, a passed thermal module with a fan, and a fan speed regulating device. The electronic systems are typically notebook computers, laptop computers, ultra-mobile personal computers, etc., which generate a large amount of heat when operating and require thermal modules to dissipate the generated heat.

The method includes steps of: (1) thermally attaching the passed thermal module to an electronic system being tested and connecting the fan to the fan speed regulating device; (2) turning on the electronic system and running the fan at a specified speed, and at the same time, monitoring the electronic system; (3) reducing the speed of the fan via the fan speed regulating the device while the electronic system is monitored until the electronic system is shut down, and recording the fan speed at which the electronic system is shut down; (4) getting a thermal resistance (Ri) of the thermal module when the thermal module runs in an open space with the fan running at the speed at which the electronic system is shut down, wherein the thermal resistance (Ri) is regarded as the electronic system's heat-dissipating requirement; (5) replacing the electronic system with another such electronic system and repeating the above four steps to get the Ri of the another electronic system until a plurality of thermal resistances (Ri) of a plurality of such electronic systems, such as 35 electronic systems, are obtained; (6) using the thermal analysis software to analyze the Ri's of the electronic systems and get an average $\overline{Ri}$ of the Ri's, the standard deviation, the normal curve, and thereby obtaining a lower control limit (LCL) of a heat-dissipating requirement for the electronic systems, as is shown in FIG. 2.

As mentioned above, the method can get the LCL, thus the variation of the electronic systems has been considered. The risk that passed thermal modules can not meet heat-dissipating requirements of some electronic systems can be greatly reduced.

The method may further comprise a step of comparing the LCL with an upper control limit (UCL) of the heat dissipation efficiency of the thermal module, wherein the UCL can be obtained via conventional methods, to check whether the thermal module can keep the electronic systems working within an acceptable temperature range and to check whether the cost of the thermal module can be reduced.

Figure 2:
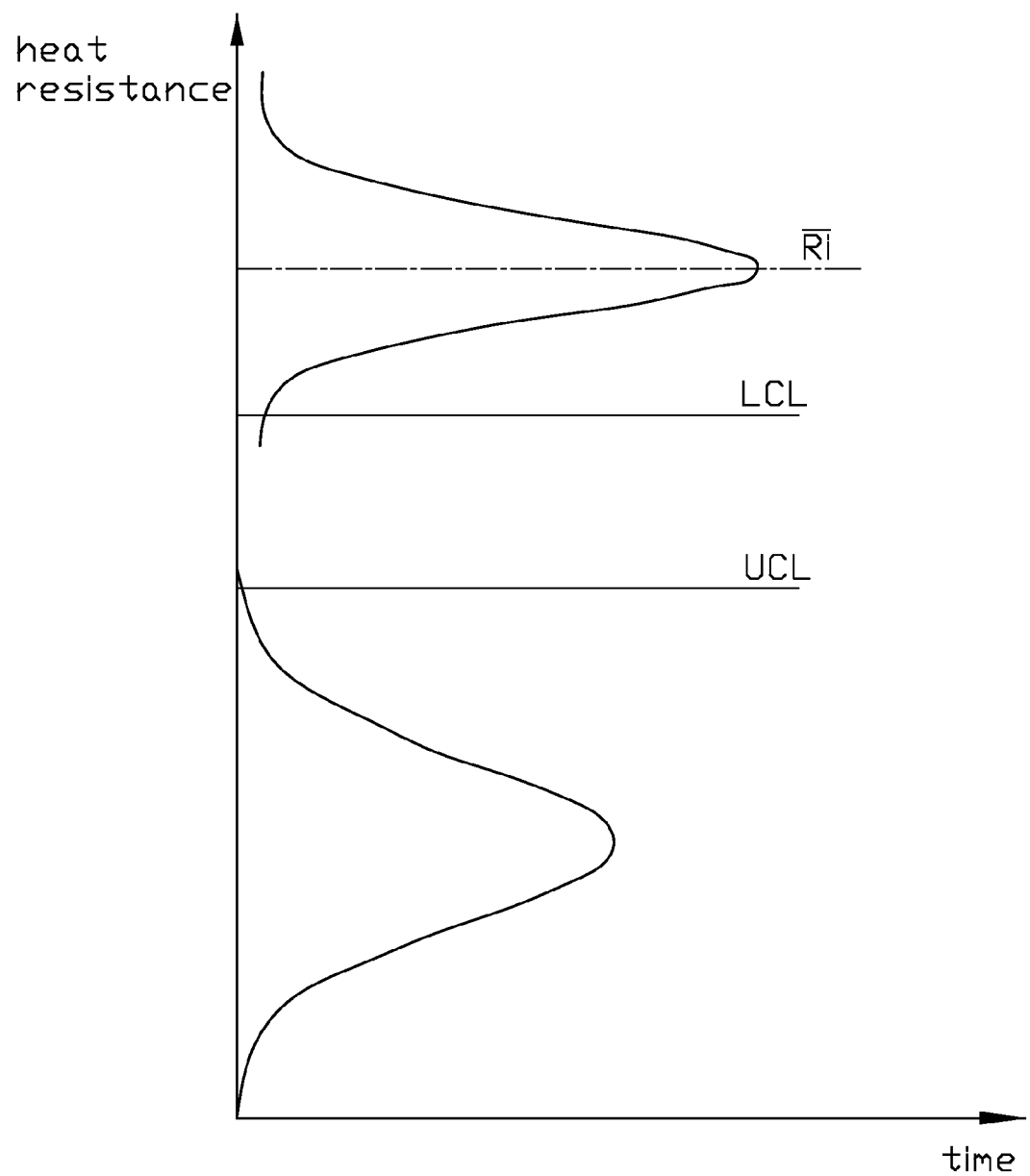
FIG. 2 illustrates relationships between a lower control limit (LCL) of heat-dissipating requirements of electronic systems and an upper control limit (UCL) of heat dissipation efficiencies of thermal modules.

FIG. 2 illustrates relationships between the LCL and the UCL. The UCL is below the LCL, since a thermal module has to be designed to satisfy an electronic system's heat-dissipating requirement. When the LCL is far larger than the UCL, the cost of the thermal modules can be reduced via reducing the heat dissipation efficiency, so long as the UCL of the thermal modules lies below the LCL.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method of obtaining accurately a heat-dissipating requirement for electronic systems of a same kind using a thermal analysis software, a passed thermal module with a fan, and a fan speed regulating device, the method including steps of:
   (1) thermally attaching the passed thermal module to an electronic system being tested and connecting the fan to the fan speed regulating device;
   (2) turning on the electronic system, running the fan, and monitoring the electronic system;
   (3) reducing the speed of the fan until the electronic system is shut down, and recording the fan speed at which the electronic system is shut down;
   (4) getting a thermal resistance (Ri) of the thermal module when the thermal module runs in an open space with the fan running at the speed at which the electronic system is shut down, wherein the Ri is regards as the electronic system's heat-dissipating requirement;
   (5) replacing the electronic system with another such electronic system and repeating the above four steps to get the Ri of the another electronic systems, until a plurality of thermal resistances corresponding to a plurality of such electronic systems are obtained; and
   (6) using the thermal analysis software to analyze the Ri's of the electronic systems and getting a lower control limit (LCL) of a heat-dissipating requirement for the electronic systems.

2. The method of claim 1, further including a step: getting an upper control limit (UCL) of a heat dissipation efficiency of the thermal module and comparing the LCL with the UCL to check whether the thermal module can keep the electronic systems working within an acceptable temperature range.

3. The method of claim 1, wherein the electronic systems are notebook computers.

4. The method of claim 1, wherein the electronic systems are laptop computers.

5. The method of claim 1, wherein the electronic systems are ultra mobile personal computers.

* * * * *